United States Patent
Barlas et al.

(10) Patent No.: US 12,424,540 B2
(45) Date of Patent: Sep. 23, 2025

(54) VIA MANUFACTURING METHOD

(71) Applicant: STMicroelectronics (Crolles 2) SAS, Crolles (FR)

(72) Inventors: Marios Barlas, Grenoble (FR); Pascal Gouraud, Montbonnot St. Martin (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 485 days.

(21) Appl. No.: 18/075,087

(22) Filed: Dec. 5, 2022

(65) Prior Publication Data
US 2023/0178479 A1 Jun. 8, 2023

(30) Foreign Application Priority Data

Dec. 7, 2021 (GR) ............................... 20210100851
Jan. 10, 2022 (FR) ........................................ 2200140

(51) Int. Cl.
*H01L 23/522* (2006.01)
*H01L 21/768* (2006.01)

(52) U.S. Cl.
CPC .... *H01L 23/5226* (2013.01); *H01L 21/76834* (2013.01); *H01L 21/76897* (2013.01)

(58) Field of Classification Search
CPC ........... H01L 23/5226; H01L 21/76834; H01L 21/76897
See application file for complete search history.

(56) References Cited

U.S. PATENT DOCUMENTS

| | | | |
|---|---|---|---|
| 6,509,267 B1 * | 1/2003 | Woo ................. | H01L 21/76801 438/678 |
| 2008/0150089 A1 | 6/2008 | Kwon et al. | |
| 2012/0018889 A1 | 1/2012 | Vannier | |
| 2012/0248609 A1 * | 10/2012 | Tomita ................ | H01L 23/5226 257/E23.161 |
| 2013/0270713 A1 * | 10/2013 | Liao ..................... | H01L 23/481 257/E21.586 |
| 2014/0199832 A1 | 7/2014 | Nguyen et al. | |
| 2020/0144158 A1 | 5/2020 | Seo et al. | |
| 2021/0175117 A1 | 6/2021 | Zeng et al. | |
| 2021/0287981 A1 * | 9/2021 | Shih ..................... | H01L 23/528 |

FOREIGN PATENT DOCUMENTS

| | | |
|---|---|---|
| CN | 1979803 A | 6/2007 |
| JP | 2014022637 A | 2/2014 |
| TW | 201342525 A | 10/2013 |

* cited by examiner

*Primary Examiner* — Karen Kusumakar
(74) *Attorney, Agent, or Firm* — Crowe & Dunlevy LLC

(57) ABSTRACT

A method is presented for manufacturing an insulated conductive via. The via crosses a first stack of layers to reach a first layer. A first cavity is formed partially extending into the first stack of layers. A second stack of layers is formed over the first stack of layers and in the first cavity. The second stack of layers includes an etch stop layer and an insulating layer. A second cavity is then formed extending completely through first and second stacks of layers to reach the first layer. An insulating liner then covers the walls and bottom of the second cavity. The insulating liner is then anisotropically etched, and the second cavity is filled by a conductive material forming the core of the via.

18 Claims, 3 Drawing Sheets

VIA MANUFACTURING METHOD

PRIORITY CLAIM

This application claims the priority benefit of Greek Application for Patent No. 20210100851, filed on Dec. 7, 2021, and claims the priority benefit of French Application for Patent No. 2200140, filed on Jan. 10, 2022, the contents of which are hereby incorporated by reference in their entireties to the maximum extent allowable by law.

TECHNICAL FIELD

The present disclosure generally concerns electronic devices and their manufacturing methods and, more particularly, concerns vias and their manufacturing methods.

BACKGROUND

The manufacturing of vias, in particular conductive vias, is an element present in most electronic device manufacturing methods.

Electronic devices have smaller and smaller dimensions. This causes a need for smaller vias and thus more accurate manufacturing methods.

There is a need in the art to all or part of the disadvantages of known via manufacturing methods.

SUMMARY

In an embodiment, a method is presented for manufacturing an insulated conductive via crossing a first stack of layers to reach a first layer. The first stack comprises at least a second conductive or semiconductor layer. The method comprises: a) forming a first cavity in the first stack, the first cavity partially crossing the second layer; b) forming a second stack comprising a third etch stop layer covered with a fourth insulating layer on the upper surface of the first stack and on the walls and the bottom of the first cavity; c) etching a second cavity crossing the first and second stacks, the second cavity extending between the bottom of the first cavity and the first layer; d) forming a fifth insulating layer covering the second stack and the walls and the bottom of the second cavity; e) anisotropic etching of the fifth layer to form an insulating sheath of the via on the walls of the second cavity, the etching being an etching of the material of the fifth layer selective over the material of the third layer; and f) filling the second cavity with a conductive material to form a conductive core of the via.

According to an embodiment, step f) also comprises the filling of the first cavity with the conductive material.

According to an embodiment, the first layer is made of a conductive material or a semiconductor material.

According to an embodiment, step c) comprises a photolithography.

According to an embodiment, the material of the fourth layer and the material of the fifth layer are selectively etchable over the material of the first layer.

According to an embodiment, the fourth and fifth layers are made of silicon oxide and the second layer is made of silicon.

According to an embodiment, the method comprises, between steps e) and f), a step of removing the third layer.

According to an embodiment, the third layer is made of a material selectively etchable over the material of the first layer.

According to an embodiment, the third layer is made of amorphous carbon.

According to an embodiment, the first stack has a thickness greater than or equal to 6 µm.

According to an embodiment, the first stack comprises at least one sixth layer made of an insulating material between the first layer and the second layer.

According to an embodiment, the second stack comprises a seventh layer made of an insulating material between the third layer and the first stack.

According to an embodiment, the material of the third layer is selectively etchable over the seventh layer.

According to an embodiment, the first stack comprises at least one eighth layer located between the second layer and the second stack.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the steps and elements that are useful for an understanding of the embodiments described herein have been illustrated and described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless otherwise specified, when reference is made to absolute positional qualifiers, such as the terms "front", "back", "top", "bottom", "left", "right", etc., or to relative positional qualifiers, such as the terms "above", "below", "upper", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Unless specified otherwise, the terms "insulating" or "conductive" are to be understood as "electrically insulating" and "electrically conductive".

FIGS. 1 to 8 show steps, preferably successive, of a method of manufacturing a via, or a connection pad, preferably a conductive via, in at least one conductive layer. The via formed by the method is an insulated via, thus comprising an insulating sheath and a conductive core.

Figure 1:
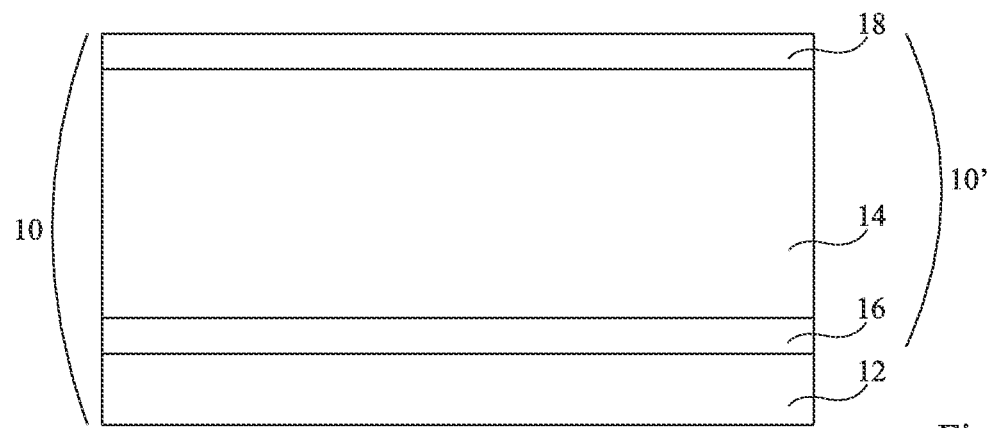
FIGS. 1 to 8 show steps of a via manufacturing method.

FIG. 1 shows a step of a method of manufacturing a via, preferably a conductive via.

During this step, a stack 10 of layers is formed. Stack 10 comprises a lower layer 12 and a stack 10' of layers resting on layer 12. Stack 10' corresponds to the layers crossed by the via, to enable the via to reach layer 12. Stack 10' is thus in contact with layer 12 at the via forming location. Stack 10', for example, has a thickness greater than or equal to 6 µm.

Layer 12 is, for example, a conductive or semiconductor layer. Layer 12 is preferably a conductive layer, preferably a metal layer, for example, made of copper.

Stack 10' of layers comprises at least one conductive or semiconductor layer 14. Layer 14 is preferably a semiconductor layer, for example, a silicon layer. Layer 14 extends over layer 12.

In the example of FIG. 1, stack 10' comprises a lower layer 16 below layer 14. Layer 16 is the layer of stack 10' closest to layer 12. Layer 16 is, in the example of FIG. 1, in contact with layer 12. Layer 16 is preferably made of an insulating material.

In the example of FIG. 1, stack 10' comprises an upper layer 18 over layer 14. Layer 18 is the layer of stack 10' most distant from layer 12. The upper surface of layer 18 thus corresponds to the upper surface of stack 10' and of stack 10, that is, the surface most distant from layer 12. Layer 18 is, in the example of FIG. 1, in contact with layer 14. Layer 16 is, for example, made of an insulating material or of a conductive or semiconductor material.

Stack 10' may, for example, comprise one or a plurality of layers, not shown, located between layer 16 and layer 14. Stack 10' may, for example, comprise one or a plurality of layers, not shown, located between layer 18 and layer 14. According to another embodiment, stack 10' only comprises layer 14.

Figure 2:
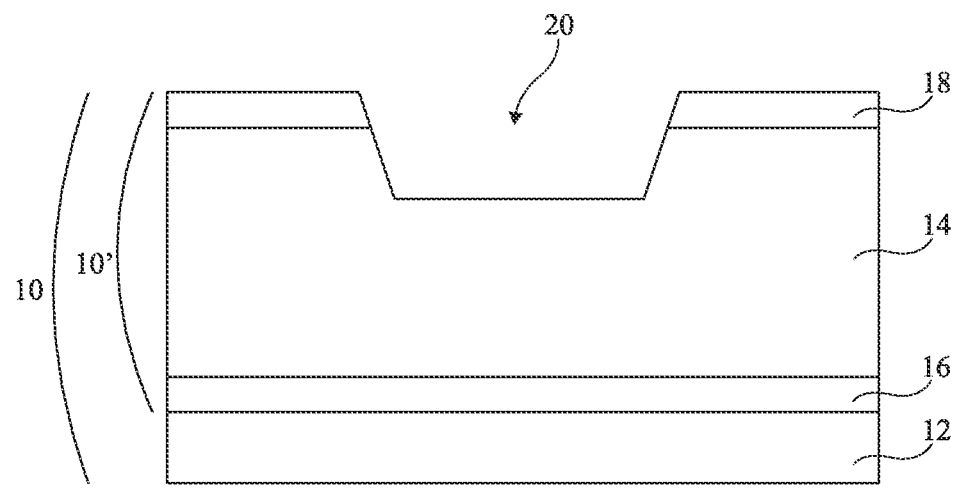

FIG. 2 shows another step of a via manufacturing method.

During this step, a cavity 20 is formed in stack 10' at the provided location of the via. Cavity 20 is, for example, formed by a photolithography step.

Cavity 20 extends from the upper surface of stack 10, through layer 18 (if present) to layer 14. Preferably, cavity 20 partially extends in layer 14. In other words, cavity 20 crosses layer 18 and extends in layer 14. The bottom of cavity 20 is located in layer 14. The bottom of cavity 20 is separated from layer 12 by a portion of layer 14.

The dimensions of the bottom of cavity 20 are greater than the desired dimensions, in the plane of the bottom of cavity 20, of the via.

Figure 3:
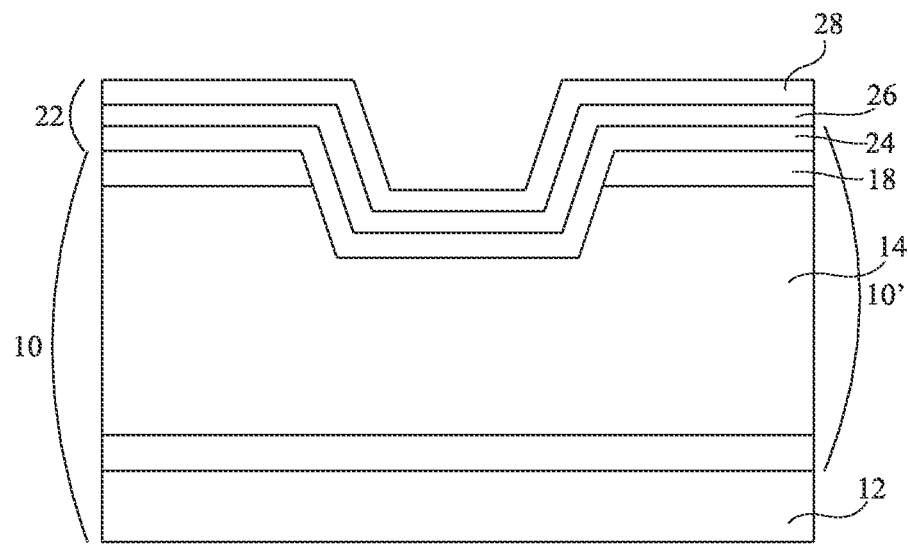

FIG. 3 shows another step of a via manufacturing method.

During this step, a stack 22 of layers is formed on the structure resulting from the step of FIG. 2, that is, the layers of stack 22 are, for example, successively formed on the structure resulting from the step of FIG. 2. In other words, stack 22 covers the upper surface of stack 10' and the walls and the bottom of cavity 20. Stack 22 comprises, in the example of FIG. 3, layers 24, 26, and 28.

Layer 24 is an electrically-insulating layer, for example, made of an oxide, for example, of silicon oxide. Layer 24 is the lower layer of stack 22, that is, the layer closest to layer 12. Layer 24 is in contact with the upper surface of stack 10', with the walls of cavity 20, and with the bottom of cavity 20.

Layer 26, forming the intermediate layer of stack 22, preferably entirely covers layer 24. Layer 26 covers layer 24 at least in cavity 20.

Layer 28, forming the upper layer of stack 22, that is, the layer most distant from layer 12, covers, preferably entirely, layer 26. Layer 28 covers layer 26 at least in cavity 20. Layer 26 is thus located between layers 24 and 28. Layer 28 is an electrically-insulating layer, for example, made of the same material as layer 24. Layer 28 enables to protect layer 26.

Layer 26 is made of a material capable of being selectively etched over the material of layer 12. In other words, there exists an etch method for etching the material of layer 26 at least twice as fast as the material of layer 12. The material of layer 26 is also selectively etchable over the material of layer 24. In other words, there exists an etch method etching the material of layer 26 at least twice as fast as the material of layer 24. Further, the material of layer 14 may be selectively etched over the material of layer 28. In other words, there exists an etch method etching the material of layer 14 at least twice as fast as the material of layer 28. The material of layer 28 may be selectively etched over the materials of layers 12 and 26. In other words, there exists an etch method etching the material of layer 28 at least twice as fast as the materials of layers 12 and 26. Layer 26 is for example made of amorphous carbon.

More generally, stack 22 comprises at least layer 26 and layer 28. Layer 24 may be omitted.

Figure 4:
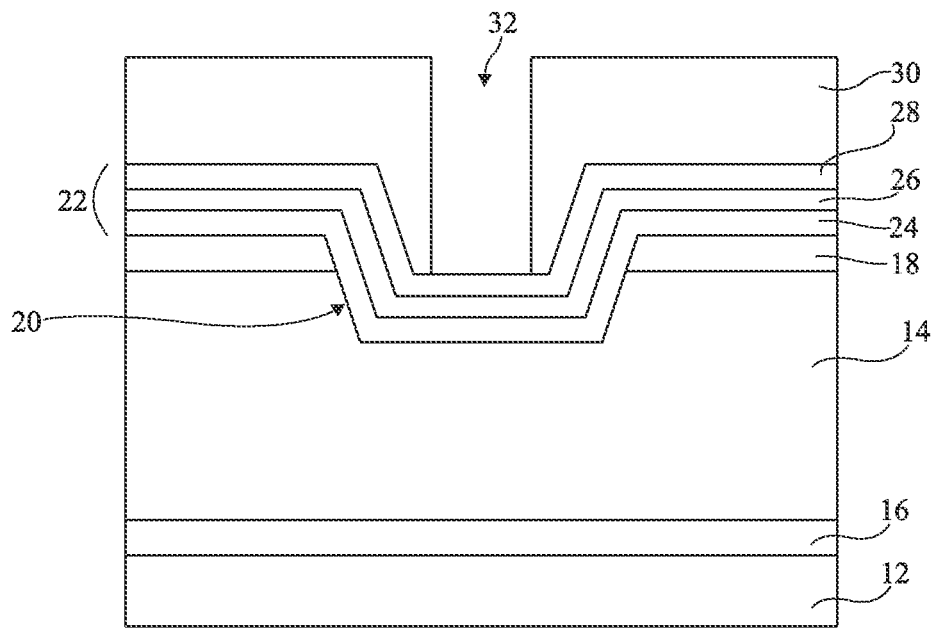

FIG. 4 shows another step of a via manufacturing method.

During this step, a photolithography mask 30 is formed on the structure resulting from the step of FIG. 3. Mask 30 is, for example, made of resin.

Mask 30 comprises an opening 32 at the level of cavity 20. The opening crosses mask 30 to reach the stack 22 at the bottom of cavity 20. In other words, opening 32 partially exposes the stack 22 at the bottom of cavity 20. The dimensions of opening 32 in the plane of the bottom of cavity 20 are smaller than the dimensions of the bottom of cavity 20.

Figure 5:
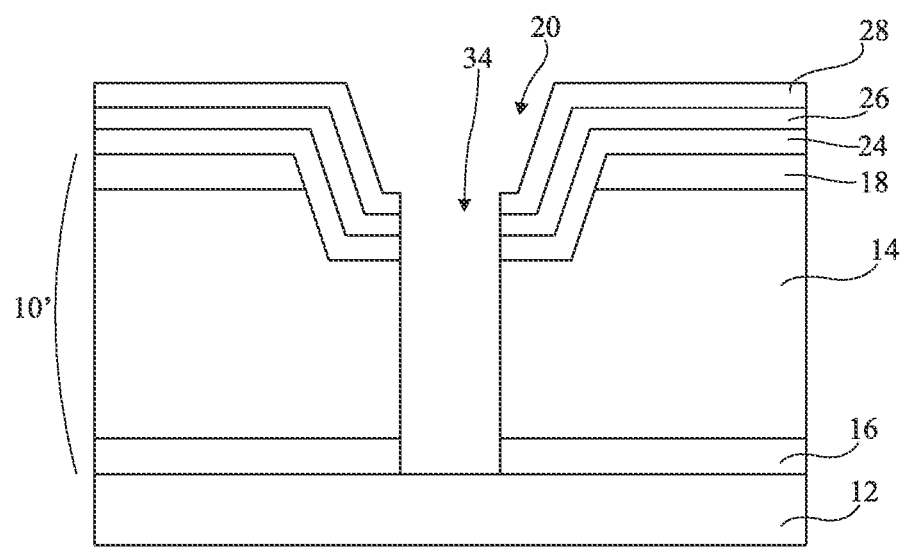

FIG. 5 shows another step of a via manufacturing method.

The step of FIG. 5 comprises the etching of stack 22 through opening 32. This etch step also causes the at least partial etching of resin mask 30.

The step of FIG. 5 then comprises the etching, through opening 32, of the portion of stack 10' located in front of opening 32. This etch step forms a cavity 34 in stacks 22 and 10'. Cavity 34 reaches layer 12 and thus exposes the portion of layer 12 in front of opening 32.

The etching of layer 14 preferably removes the rest of mask 30. The etching of layer 14 may cause the partial etching of layer 28. The thickness of layer 28 and the thickness of mask 30 are preferably selected so that layer 26 is entirely covered with layer 28 after the etching of stack 10'. Layer 26 is thus preferably not exposed during the etching of stack 10'.

Figure 6:
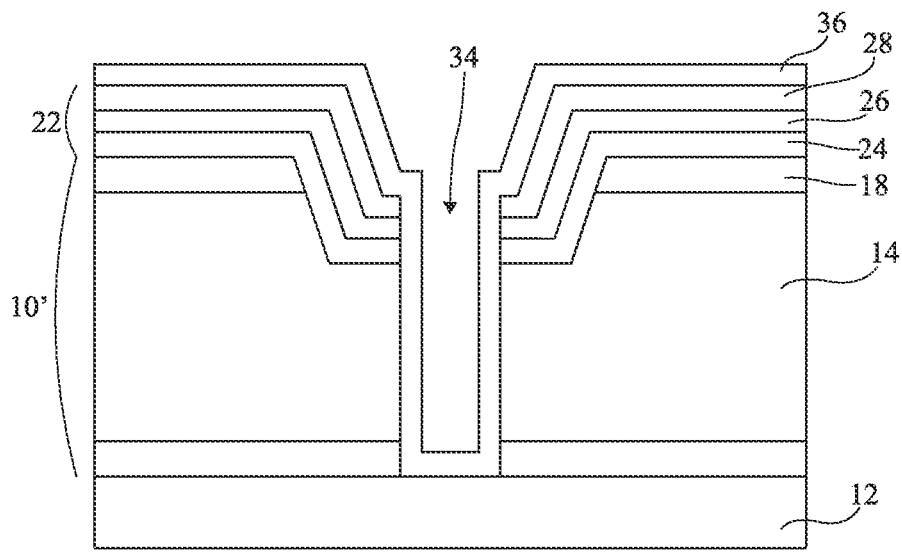

FIG. 6 shows another step of a via manufacturing method.

During this step, an insulating layer 36 is formed on the structure resulting from the step of FIG. 5. Layer 36 is made of the same material as layer 28.

Layer 36 conformally covers the structure. In other words, layer 36 covers the upper surface of layer 28, and the walls and the bottom of cavity 34.

The portions of layer 36 located on the walls of cavity 34 are intended to form the sheath of the via, that is, to insulate the conductive via from the layers of stack 10', in particular of layer 14. The thickness of layer 36 is thus not sufficient to entirely fill cavity 34.

Figure 7:
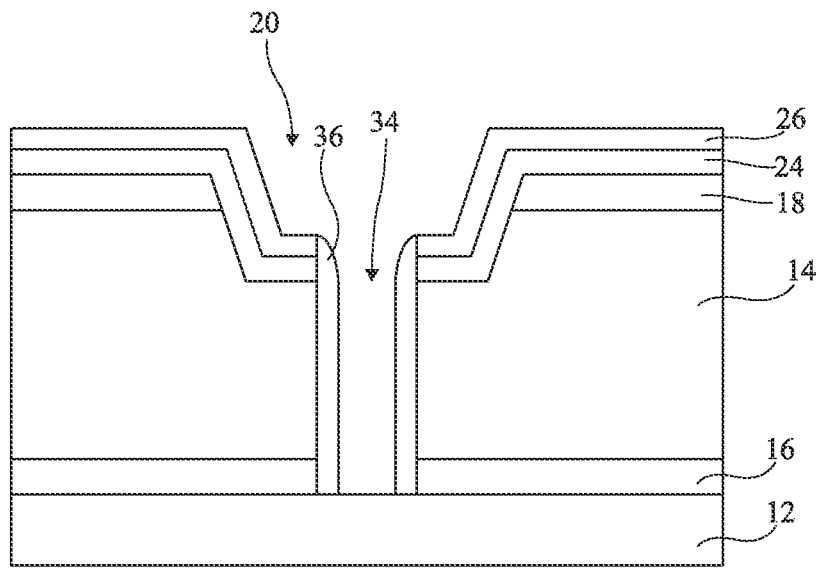

FIG. 7 shows another step of a via manufacturing method.

This step comprises an anisotropic etching of layers 28 and 36. Thus, the portions of layers 28 and 36 located on layer 26 are etched. The portion of layer 36 located at the bottom of cavity 34, that is, in contact with layer 12, is etched. Thus, layer 12 is exposed. Similarly, layer 26 is exposed. Preferably, the upper surface of layer 26 is entirely exposed. The portions of layer 36 located on the walls of cavity 34 are not removed. In particular, the lateral walls of layer 14 are separated from cavity 34 by the portions of layer 36.

The etching is a selective etching of the material of layers 28 and 36. The etching is thus such that the materials of layers 26 and 12 are not etched during the etching of layers 28 and 36. Layer 26 thus protects the portions of stack 10 on which it is located during the etching of layers 28 and 36 and ascertains that layer 28 and the portions of layer 36 which are not on the lateral walls of cavity 34 can entirely be removed.

Figure 8:
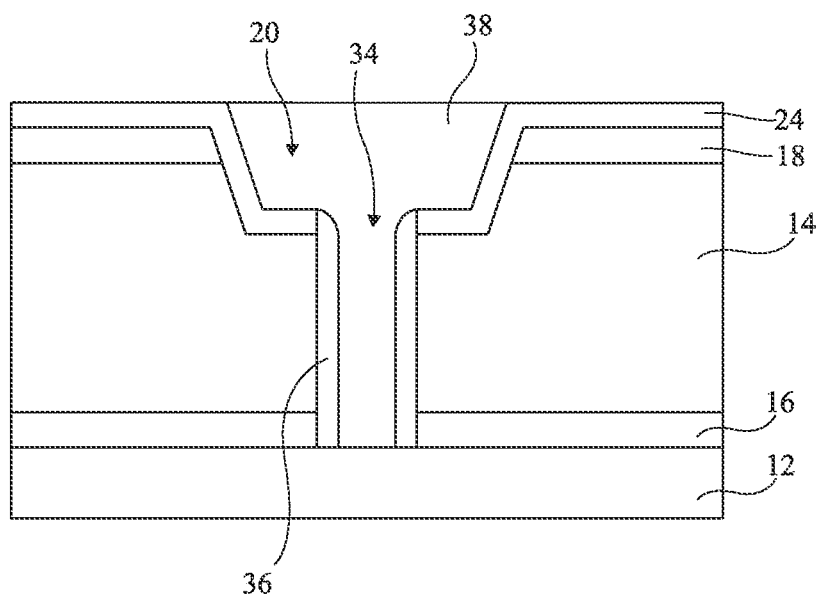

FIG. 8 shows another step of a via manufacturing method.

During this step, layer 26 is etched, for example, by an oxygen or hydrogen plasma. Since the material of layer 26 can be selectively etched over the materials of layers 24 and of layer 12, layer 24 and layer 12 are not etched, or destroyed, during this step.

Further, the conductive core 38 of the via is formed. Core 38, for example, entirely fills cavity 34 and cavity 20. The core preferably extends from layer 12 to the level of the upper surface of layer 24. Core 38 is thus in contact with layer 12 by its lower surface.

Core 38 is, for example, formed by a damascene method, that is, the deposition of a layer of the material of the core, the layer having a thickness sufficient to fill cavities 20 and 34, and the chemical-mechanical polishing of said layer to remove it outside of cavities 20 and 34. The chemical-mechanical polishing is, for example, a method enabling to etch the material of core 38 selectively over layers 18 and 24.

As a variant, the core may entirely fill cavity 34 but not entirely fill cavity 20. For example, peripheral portions of cavity 20 may not be filled with core 38.

It could have been chosen to form the via without forming stack 22. It would then have been necessary to add a photolithography step to remove the portion of layer 36 located at the bottom of cavity 36. The lateral dimensions of cavity 34 would then have to be sufficiently large to allow the forming of the photolithography mask.

An advantage of the described embodiments is that they enable to better control the form factor of the vias, in particular to form vias of smaller horizontal dimensions and to form deeper vias.

Another advantage of the described embodiments is that they require a smaller number of steps, in particular a smaller number of photolithography steps.

Another advantage of the described embodiments is that the vias are self-aligned with the connection track. This enables, during the manufacturing of an interconnection network, to decrease the dimensions of said network.

Various embodiments and variants have been described. Those skilled in the art will understand that certain features of these various embodiments and variants may be combined, and other variants will occur to those skilled in the art.

Finally, the practical implementation of the described embodiments and variations is within the abilities of those skilled in the art based on the functional indications given hereabove.

The invention claimed is:

1. A method of manufacturing, comprising:
   a) forming a first cavity in a first stack of layers, wherein the first stack of layers includes at least one conductive or semiconductor layer and a first layer, said first cavity in the first stack of layers crossing partially through the at least one conductive or semiconductor layer;
   b) forming, on an upper surface of the first stack of layers and on walls and a bottom of the first cavity, a second stack of layers comprising an etch stop layer covered with a first insulating layer;
   c) etching a second cavity crossing through the first stack of layers and the second stack of layers, the second cavity extending between a bottom of the first cavity and the first layer;
   d) forming a second insulating layer covering the second stack of layers and the walls and the bottom of the second cavity;
   e) anisotropic etching the second insulating layer to form an insulating sheath on the walls of the second cavity, wherein said anisotropic etching etches a material of the second insulating layer selective over the material of the etch stop layer; and
   f) filling the second cavity with a conductive material to form a conductive core of an insulated conductive via crossing the first stack of layers to reach the first layer.

2. The method according to claim 1, wherein step f) also comprises filling the first cavity with the conductive material.

3. The method according to claim 1, wherein the first layer is made of a conductive or semiconductor material.

4. The method according to claim 1, wherein step c) comprises a photolithographically defining a location of the second cavity before etching.

5. The method according to claim 1, wherein a material of the first insulating layer and a material of the second insulating layer are selectively etchable over a material of the first layer.

6. The method according to claim 1, wherein the first and second insulating layers are made of silicon oxide and wherein the at least one conductive or semiconductor layer is made of silicon.

7. The method according to claim 1, further comprising, between steps e) and f), removing the etch stop layer.

8. The method according to claim 1, wherein the etch stop layer is made of a material selectively etchable over the material of the first layer.

9. The method according to claim 1, wherein the etch stop layer is made of amorphous carbon.

10. The method according to claim 1, wherein the first stack of layers has a thickness greater than or equal to 6 μm.

11. The method according to claim 1, wherein the first stack of layers comprises at least one insulating layer between the first layer and the at least one conductive or semiconductor layer.

12. The method according to claim 1, wherein the second stack comprises a further insulating layer located between the etch stop layer and the first stack.

13. The method according to claim 12, wherein a material of the etch stop layer is selectively etchable over the further insulating layer.

14. The method according to claim 1, wherein the first stack of layers comprises at least one layer made of an insulating material or of a conductive or semiconductor material located between the at least one conductive or semiconductor layer and the second stack of layers.

15. A method of manufacturing an insulated conductive via, comprising:
   forming a first stack of layers over a base conductive or semiconductor layer, the first stack of layers including a conductive or semiconductor layer;
   forming a first cavity extending partially through the conductive or semiconductor layer of the first stack of layers;
   forming a second stack of layers over the first stack of layers and in the first cavity;
   wherein the second stack of layers includes an etch stop layer covered with an insulating layer;

forming a mask over the insulating layer of the second stack of layers, said mask having an opening aligned with the first cavity but having a smaller dimension than the first cavity;

using the opening in the mask to etch a second cavity extending completely through the second stack of layers and further extending completely through a remaining part of the conductive or semiconductor layer of the first stack of layers to reach said base conductive or semiconductor layer;

conformally depositing an insulating liner within the second cavity;

anisotropically etching the insulating liner; and filling the second cavity with a conductive core.

16. The method of claim 15, further comprising, after anisotropically etching and before filling the second cavity, removing the etch stop layer of the second stack of layers.

17. The method according to claim 15, wherein the etch stop layer is made of a material selectively etchable over the base conductive or semiconductor layer.

18. The method according to claim 15, wherein the etch stop layer is made of amorphous carbon.

* * * * *